United States Patent
Mirzaei et al.

(10) Patent No.: US 9,629,093 B2
(45) Date of Patent: Apr. 18, 2017

(54) PROGRAMMABLE TRANSMITTER CIRCUITS

(71) Applicant: BROADCOM CORPORATION, Irvine, CA (US)

(72) Inventors: Alex Ahmad Mirzaei, Irvine, CA (US); Hooman Darabi, Laguna Niguel, CA (US); Masoud Kahrizi, Irvine, CA (US); Behnam Mohammadi, Irvine, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/804,194

(22) Filed: Jul. 20, 2015

(65) Prior Publication Data

US 2016/0381632 A1   Dec. 29, 2016

Related U.S. Application Data

(60) Provisional application No. 62/184,168, filed on Jun. 24, 2015.

(51) Int. Cl.
| | |
|---|---|
| *H03F 1/02* | (2006.01) |
| *H04W 52/00* | (2009.01) |
| *H03F 3/21* | (2006.01) |
| *H04B 1/04* | (2006.01) |
| *H04W 52/02* | (2009.01) |

(52) U.S. Cl.
CPC ............ *H04W 52/028* (2013.01); *H04B 1/04* (2013.01); *H04B 2001/045* (2013.01); *H04B 2001/0433* (2013.01)

(58) Field of Classification Search
CPC . H04W 52/02; H04W 52/0209; H04W 52/00; H03F 3/21; H03F 3/45; H03F 3/193; H03F 1/02; H04B 1/40; H04B 1/04; H04B 2001/0416
USPC ............ 330/253; 455/103, 127.1, 127.3, 129
See application file for complete search history.

(56) References Cited

U.S. PATENT DOCUMENTS

| | | | | |
|---|---|---|---|---|
| 2011/0050344 A1* | 3/2011 | He | ........................ | H04B 1/0483 330/276 |
| 2015/0244328 A1* | 8/2015 | Toivonen | .............. | H03F 1/3241 330/261 |
| 2015/0303876 A1* | 10/2015 | Chan | ..................... | H03F 1/0205 330/253 |

* cited by examiner

*Primary Examiner* — Blane Jackson
(74) *Attorney, Agent, or Firm* — McDermott Will & Emery LLP

(57) ABSTRACT

A programmable transmitter circuit may be coupled to a controller circuit. The controller circuit may be configured to generate control signals based at least on a signal. The transmitter circuit may include a plurality of unit cells. Each unit cell may include a respective first current source and a respective second current source. Each unit cell may be configured to be set in an activated state or a deactivated state based at least on the control signals. For a unit cell of the plurality of unit cells, when the unit cell is set in the activated state, the respective first current source or the respective second current source may be configured to generate a current to be applied to a load.

19 Claims, 10 Drawing Sheets

PROGRAMMABLE TRANSMITTER CIRCUITS

CROSS-REFERENCE TO RELATED APPLICATIONS

This application claims the benefit of U.S. Provisional Patent Application No. 62/184,168, filed on Jun. 24, 2015, entitled "Programmable Transmitter Circuits," which is hereby incorporated by reference in its entirety.

TECHNICAL FIELD

The present description relates generally to wireless communications, including programmable transmitter circuits.

BACKGROUND

A transmitter circuit is utilized to transmit signals to a load. A transmitter circuit is generally designed with consideration to die size and efficiency (e.g., ratio of power output from the transmitter circuit to power consumed by the transmitter circuit). The load may be, for example, an antenna that receives the signals from the transmitter circuit and converts the signals into radio waves for propagation through the atmosphere.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, the subject technology is not limited to the specific details set forth herein and can be practiced using one or more implementations. In one or more instances, structures and components are shown in block diagram form in order to avoid obscuring the concepts of the subject technology. One or more implementations of the subject disclosure are illustrated by and/or described in connection with one or more figures and are set forth in the claims.

The subject technology provides transmitter circuits that are programmable by control signals. The subject technology may scale along with the down-scaling of complementary metal-oxide-semiconductor (CMOS) technology, contrary to other transmitter circuit designs. In one or more implementations, the subject technology allows for high efficiency and small silicon area usage.

Figure 1:
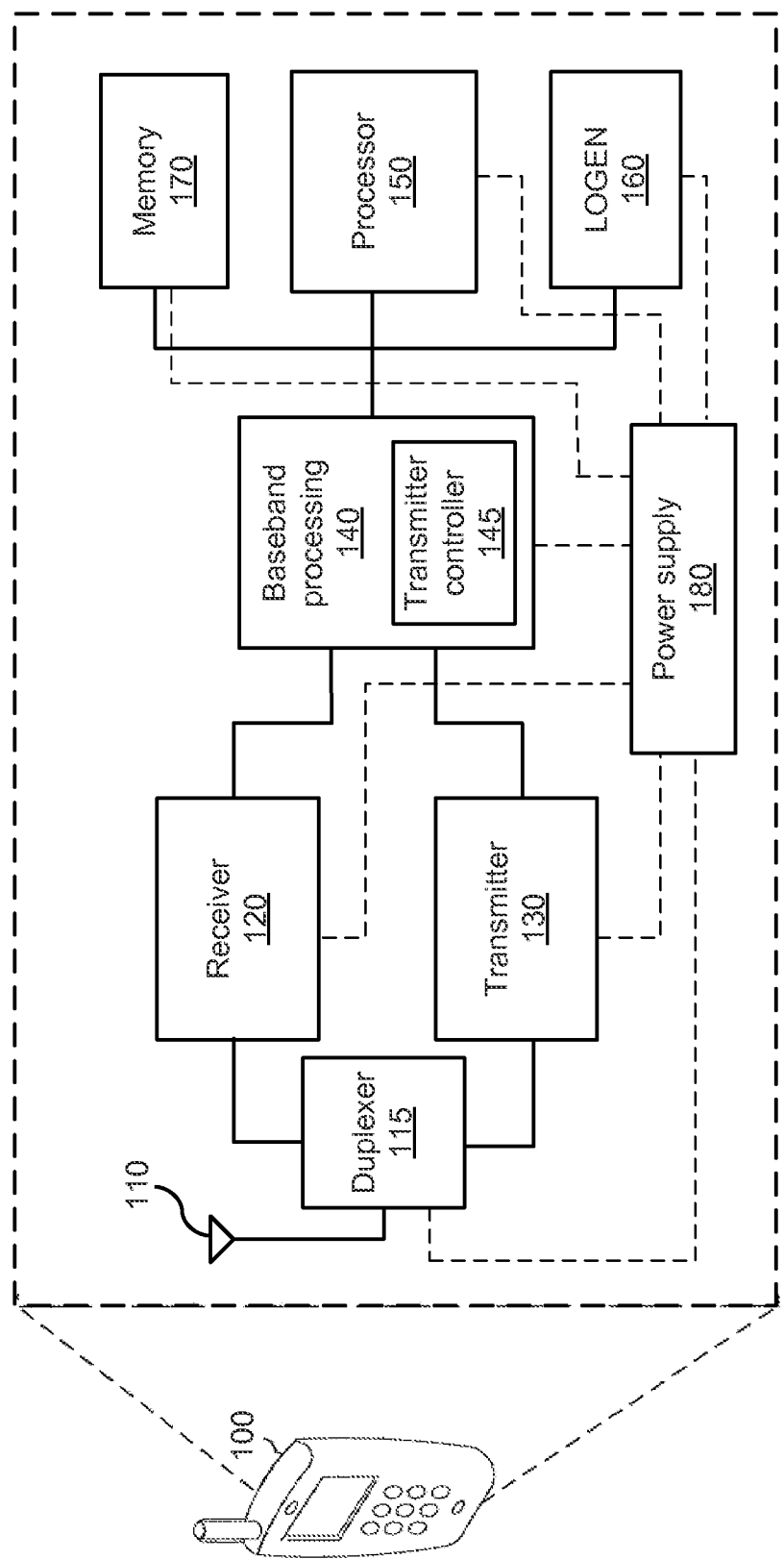
FIG. 1 illustrates an example wireless communication device in which a system for programmable transmitter circuits may be implemented in accordance with one or more implementations.

FIG. 1 illustrates an example wireless communication device 100 in which a system for programmable transmitter circuits may be implemented in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The wireless communication device 100 includes a radio-frequency (RF) antenna 110, a duplexer circuit 115, a receiver circuit 120, a transmitter circuit 130, a baseband processing circuit 140, a transmitter controller circuit 145, a processor circuit 150, a local oscillator generator (LOGEN) 160, a memory 170, and a power supply 180. In one or more implementations, one or more of the components represented in FIG. 1 may be integrated on one or more semiconductor substrates. For example, the receiver circuit 120, transmitter circuit 130, baseband processing circuit 140, processor circuit 150, LOGEN 160, and/or memory 170 may be realized in a single chip or a single system on chip, or may be realized in a multi-chip chipset.

The RF antenna 110 may be suitable for transmitting and/or receiving RF signals (e.g., wireless signals) over a range of frequencies (e.g., 800 MHz, 1.7 GHz, 2.1 GHz, 2.4 GHz, 2.6 GHz, 5 GHz, etc.). Although a single RF antenna 110 is illustrated, additional RF antennas may be utilized. The duplexer circuit 115 may provide isolation in a transmit band to facilitate avoiding saturation of the receiver circuit 120 and/or facilitate avoiding damaging parts of the receiver circuit 120. The duplexer circuit 115 may attenuate noise in a receive band. The duplexer circuit 115 may be operable in multiple frequency bands of various standards (e.g., wireless standards, cellular standards).

The receiver circuit 120 may include suitable logic circuitry and/or code that may be operable to receive and process signals from the RF antenna 110. The receiver circuit 120 may, for example, be operable to amplify and/or down-convert received wireless signals. In some aspects, the receiver circuit 120 may be operable to cancel noise in received signals and/or may be linear over a wide range of frequencies. The receiver circuit 120 may be suitable to allow receipt of signals in accordance with a variety of standards (e.g., wireless standards, cellular standards). By way of non-limiting example, such standards may include Wi-Fi, WiMAX, Bluetooth, GSM, and LTE.

The transmitter circuit 130 may include suitable logic circuitry and/or code that may be operable to process and transmit signals from the RF antenna 110. The transmitter circuit 130 may, for example, be operable to up-convert baseband signals to RF signals and amplify RF signals. The transmitter circuit 130 may be operable to provide RF signals for further amplification by one or multiple power amplifiers. In some aspects, the transmitter circuit 130 may be operable to up-convert and amplify baseband signals processed in accordance with a variety of standards.

The baseband processing circuit 140 may include suitable logic, circuitry, interfaces, and/or code that may be operable to perform processing of baseband signals. The baseband processing circuit 140 may, for example, generate control and/or feedback signals for configuring various components of the wireless communication device 100, such as the receiver circuit 120 and the transmitter circuit 130. In some aspects, the baseband processing circuit 140 may include a transmitter controller circuit 145 that includes suitable logic, circuitry, interfaces, and/or code for generating control and/or feedback signals for configuring various components of the transmitter circuit 130. The baseband processing circuit 140 may also include a corresponding receiver controller circuit (not shown) for generating control and/or feedback signals for configuring various components of the receiver circuit 120.

The baseband processing circuit 140 may receive signals from and provide signals to the receiver circuit 120 (e.g., to facilitate receiving information by the wireless communication device 100 through the RF antenna 110) and the transmitter circuit 130 (e.g., to facilitate transmitting information by the wireless communication device 100 through the RF antenna 110). The baseband processing circuit 140 may be operable to encode, decode, transcode, modulate, demodulate, encrypt, decrypt, scramble, descramble, and/or otherwise process data in accordance with one or more standards.

The processor circuit 150 may include suitable logic, circuitry, and/or code that enable processing data and/or controlling operations of the wireless communication device 100. In this regard, the processor circuit 150 may be enabled to provide control signals to various other portions of the wireless communication device 100. The processor circuit 150 may also control transfers of data between various portions of the wireless communication device 100. Additionally, the processor circuit 150 may enable implementation of an operating system or otherwise execute code to manage operations of the wireless communication device 100.

The LOGEN 160 may include suitable logic, circuitry, interfaces, and/or code that are operable to generate one or more oscillating signals of one or more frequencies. The oscillating signals may be referred to as local oscillator (LO) signals. The LOGEN 160 may be operable to generate digital and/or analog signals. In this manner, the LOGEN 160 may be operable to generate one or more clock signals and/or sinusoidal signals. Characteristics of the oscillating signals such as frequency and duty cycle may be determined based on one or more control signals from, for example, the baseband processing circuit 140 and/or the processor circuit 150. In one or more implementations, the LOGEN 160 may be, may include, or may be a part of, a voltage-controlled oscillator (VCO).

The memory 170 may include suitable logic, circuitry, and/or code that enable storage of various types of information such as received data, generated data, code, and/or configuration information. The memory 170 may include, for example, RAM, ROM, flash, and/or magnetic storage. Information stored in the memory 170 may be utilized for configuring the receiver circuit 120, transmitter circuit 130, and/or baseband processing circuit 140.

In operation, the processor circuit 150 may configure the various components of the wireless communication device 100 based on a standard according to which the wireless communication device 100 receives signals. Wireless signals may be received via the RF antenna 110 and amplified and down-converted by the receiver circuit 120. The baseband processing circuit 140 may perform noise estimation and/or noise cancellation, decoding, and/or demodulation of baseband signals. In this manner, information in the received signal may be recovered and utilized appropriately. For example, the information may be audio and/or video to be presented to a user of the wireless communication device 100, data to be stored to the memory 170, and/or information affecting and/or enabling operation of the wireless communication device 100. The baseband processing circuit 140 may modulate, encode, and perform other processing on audio, video, and/or control signals to be transmitted by the transmitter circuit 130 in accordance with various standards. The power supply 180 may provide one or multiple regulated rail voltages (e.g., $V_{DD}$) for various components of the wireless communication device 100.

Figure 2:
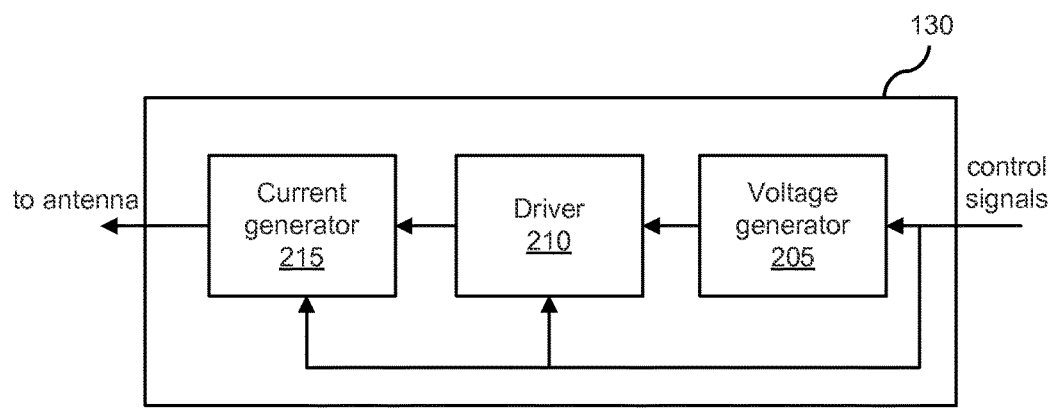
FIG. 2 illustrates an example transmitter circuit in accordance with one or more implementations.

FIG. 2 illustrates an example of the transmitter circuit 130 shown in FIG. 1, in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The transmitter circuit 130 includes a voltage generator 205, a driver circuit 210, and a current generator 215. The voltage generator 205 may be utilized to generate voltages for the driver circuit 210. The driver circuit 210 may be utilized to apply voltages to the current generator 215. The current generator 215 may be utilized to generate a current based at least on the voltages applied by the driver circuit 210. The generated current may be provided for transmission to a load (e.g., the RF antenna 110). The voltage generator 205, driver circuit 210, and current generator 215 may receive control signals. In one or more implementations, the control signals include LO signals, signals associated with a magnitude of a baseband signal, and/or signals associated with a polarity of a baseband signal. Each of the voltage generator 205, driver circuit 210, and current generator 215 will be described later in the present disclosure.

Figure 3:
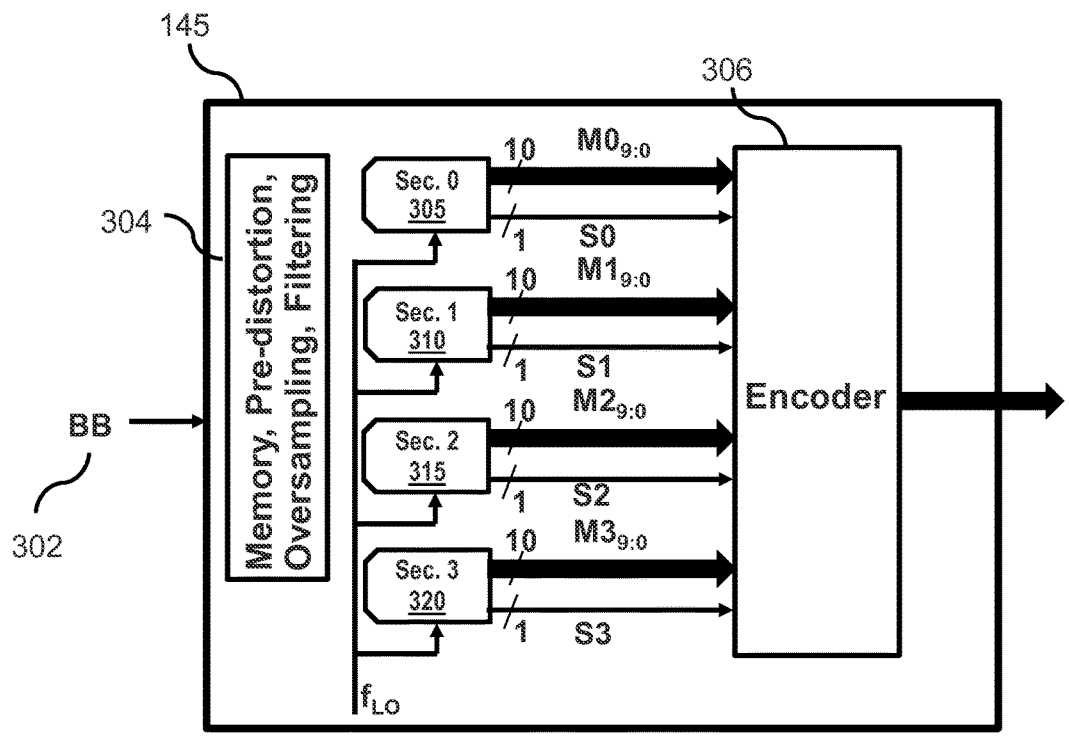
FIG. 3 illustrates an example transmitter controller circuit in accordance with one or more implementations.

FIG. 3 illustrates an example of the transmitter controller circuit 145 shown in FIG. 1, in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The transmitter controller circuit 145 receives a signal 302 and generates control signals based at least on the signal 302. The transmitter controller circuit 145 includes circuitry 304 for performing filtering on the signal 302, such as pre-distortion filtering and oversampling filtering. The transmitter controller circuit 145 also includes processing circuits 305, 310, 315, and 320 for processing signal components contained in, derived from, and/or otherwise associated with the signal 302.

In one or more implementations, the signal 302 is a baseband signal that includes an in-phase (I) signal component and a quadrature (Q) signal component. The transmitter controller circuit 145 may generate additional signal components based on the I and Q signal components of the signal 302. Each of the signal components is associated with a respective transmitter section and is offset in phase from another signal component. For example, the transmitter controller circuit 145 may generate a $(I+Q)/\sqrt{2}$ signal component and a $(-I+Q)/\sqrt{2}$ signal component. The I, $(I+Q)/\sqrt{2}$, Q, and $(-I+Q)/\sqrt{2}$ signal components may be referred to as the 0° component, 45° component, 90° component, and 135° component, respectively, and may be associated with transmitter sections 0, 1, 2, and 3, respectively. The transmitter sections may be associated with a transmitter, as will be described later in the present disclosure. The index/identifier associated with each transmitter section (e.g., 0, 1, 2, 3) may be arbitrary and utilized for convenience in identifying the various signal components. The signal components may be provided to respective processing circuits (e.g., the processing circuits 305, 310, 315, 320). Although the transmitter controller circuit 145 shown in FIG. 3 is associated with four signal components offset in phase by 45 degrees, the transmitter controller circuit 145 may be associated with more, fewer, and/or different signal components.

The respective processing circuit generates a sign bit (e.g., S0, S1, S2, S3) associated with a polarity of the signal component, and magnitude bit sequences (e.g., $M0_{9:0}$, $M1_{9:0}$, $M2_{9:0}$, $M3_{9:0}$) associated with a magnitude of the signal component. For example, the magnitude bit sequences $M0_{9:0}$, $M1_{9:0}$, $M2_{9:0}$, and $M3_{9:0}$ include 10 bits (e.g., bit 0 through bit 9) that may be utilized to represent the magnitude of the respective signal component. In some aspects, the transmitter controller circuit 145 is utilized as a controller circuit for the transmitter circuit 130 of FIG. 2, where control signals provided to the transmitter circuit 130 may be, may include, and/or may be derived from, the sign bit and/or the magnitude bit sequences. The transmitter controller circuit 145 may include an encoder circuit 306 that generates control signals based at least on the magnitude bit sequences and/or the sign bits and provides the generated control signals for transmission to the transmitter circuit 130. The processing circuits 305, 310, 315, and 320 may be sampled at an LO clock frequency $f_{LO}$ (e.g., 2.4 GHz).

Figure 4:
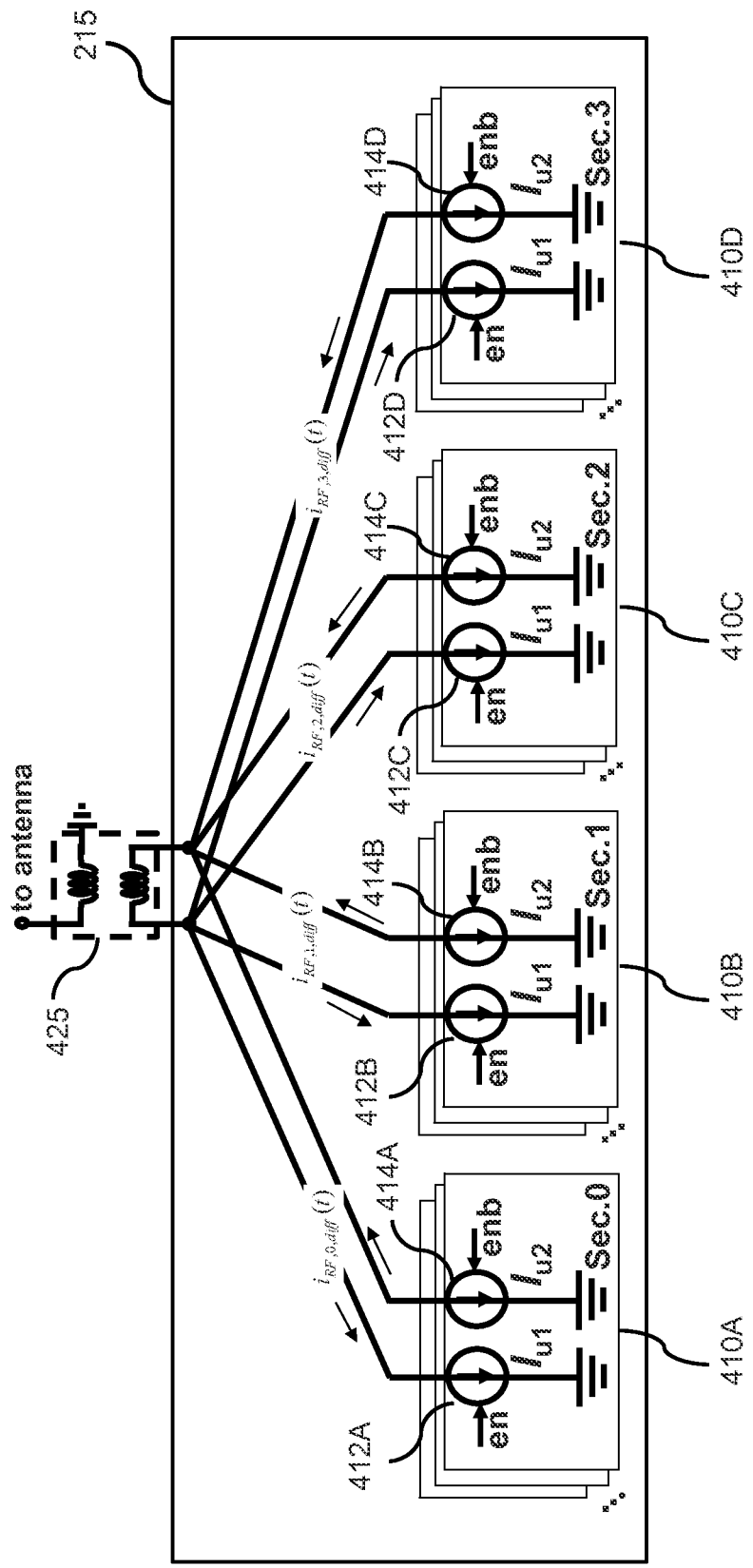
FIG. 4 illustrates an example current generator in accordance with one or more implementations.

FIG. 4 illustrates an example of the current generator 215 shown in FIG. 2, in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The current generator 215 may be associated with multiple transmitter sections (e.g., sections 0, 1, 2, 3), with each transmitter section being associated with multiple unit cells (e.g., a unit cell 410A, 410B, 410C, and 410D). The unit cells associated with each transmitter section may include a respective first current source (e.g., first current source 412A, 412B, 412C, 412D) and a respective second current source (e.g., second current source 414A, 414B, 414C, 414D). The first current source and the second current source may have a magnitude of $I_{u1}$ and $I_{u2}$, respectively. In one or more implementations, the first current source and the second current source of each unit cell are of the same magnitude $I_{u1}=I_{u2}=I_u$ but with opposite polarity from one another relative to a load (e.g., the RF antenna 110 in FIG. 1). For example, the first current source $I_{u1}$ may provide a positive current away from a transformer 425 and the second current source $I_{u2}$ may provide a positive current toward the transformer 425. The transformer 425 might or might not be integrated on-chip with the unit cells of the transmitter sections.

Each transmitter section of the current generator 215 may generate a current signal $i_{RF,k,diff}(t)$ and provide the generated current to the transformer 425, where k is an index/identifier associated with the transmitter section of the current generator 215 (e.g., transmitter sections 0, 1, 2, 3). For a $k^{th}$ transmitter section, at a given time t, the current signal $i_{RF,k,diff}(t)$ provides a difference between total current generated by the second current sources of the $k^{th}$ transmitter section that are activated (e.g., on) and total current generated by the first current sources of the $k^{th}$ transmitter section that are activated. The transformer 425 may receive and couple the respective current signals $i_{RF,k,diff}(t)$ to the load.

The current generator 215 may receive control signals (e.g., en, enb) from a controller circuit. Based on the control signals, a unit cell may be activated (e.g., on, turned on) or deactivated (e.g., off, turned off). For example, when a unit cell is activated, one of the first current source or the second current source is activated (e.g., on, turned on). The current source that is activated may generate a current and provide the generated current to the transformer 425. When a unit cell is deactivated, both the first current source and the second current source are deactivated (e.g., off, turned off).

The current generator 215 may receive signals from the transmitter controller circuit 145 shown in FIG. 3 (e.g., the sign bits, magnitude bit sequences, etc.). In such cases, the control signals en and enb shown in FIG. 4 may be, may include, or may be based on, the sign bit (e.g., S0, S1, S2, S3) from the transmitter controller circuit 145 and/or the magnitude bit sequences (e.g., $M0_{9:0}$, $M1_{9:0}$, $M2_{9:0}$, $M3_{9:0}$) from the transmitter controller circuit 145. The control signals en and enb may also be based on LO signals. The current generator 215 may utilize a number of different non-overlapping LO signals. In some aspects, the number of non-overlapping LO signals may be twice the number of transmitter sections. For example, with four transmitter sections, the current generator 215 may utilize eight different non-overlapping LO signals, each with a duty cycle of ⅛.

In one of more implementations, for a given transmitter section, values of the magnitude bits may determine how many of the unit cells associated with the transmitter section is to be activated, and a value (e.g., 0 or 1) of the sign bit may determine which of the first current source (e.g., the first current source 412A) or the second current source (e.g., the second current source 414A) is to be activated for the unit cells associated with the transmitter section. For example, each transmitter section of the current generator 215 may include $2^n$ unit cells, where n is the number of bits in the magnitude bit sequence. With reference to FIGS. 3 and 4, the transmitter sections 0, 1, 2, and 3 may each be associated with $2^{10}$ unit cells, since the magnitude bit sequences $M0_{9:0}$, $M1_{9:0}$, $M2_{9:0}$, and $M3_{9:0}$ include 10 bits. By way of non-limiting example, a sign bit of S0=0 and a magnitude bit sequence of $M0_{9:0}=00100101_2=37_{10}$ may indicate that 37 unit cells associated with transmitter section 0 are to be activated, with the first current source in these 37 unit cells being activated (e.g., turned on). The remaining unit cells associated with transmitter section 0 are deactivated.

As another example, each transmitter section of the current generator 215 may include fewer or more than $2^n$ unit cells, where n is the number of bits in the magnitude bit sequence. The transmitter sections may include the same number of unit cells. Using the transmitter section 0 as an example, the ten bits $b_9b_8b_7b_6b_5b_4b_3b_2b_1b_0$ of the magnitude bit sequence $M0_{9:0}$ may be divided into six most significant bits (MSBs) $b_9b_8b_7b_6b_5b_4$ and four least significant bits (LSBs) $b_3b_2b_1b_0$. Each of the LSBs may be utilized to control, for example, $3^i x$ unit cells, where i is the index of the bit and x is a positive integer number, such that $b_0$ controls $3^0 x$ unit cells, $b_1$ controls $3^1 x$ unit cells, $b_2$ controls $3^2 x$ unit cells, and $b_3$ controls $3^3 x$ unit cells. Each of the MSBs may be utilized to control, for example, $3^{i-4} y$ unit cells, where y is a positive integer number, such that $b_4$ controls $3^0 y$ unit cells, $b_5$ controls $3^1 y$ unit cells, $b_6$ controls $3^2 y$ unit cells, and so forth. For example, if $b_8$ is set to a high level logic, the $3^4 y$ unit cells controlled by $b_3$ are activated. The number of unit cells in the transmitter section 0 is $(1+3+9+27)x+(1+3+9+27+81+243)y$. In some aspects, y may be greater than x (e.g., x=1, y=16).

The other transmitter sections may have the same number of unit cells and the same number of unit cells controlled by each corresponding magnitude bit (e.g., $b_3$ of transmitter section 3 controls the same number of unit cells as $b_3$ of transmitter section 0). Other ways of utilizing the sign bit and the magnitude bit sequence to determine the number of unit cells to activate and which current source within the unit cell to activate (e.g., turn on) aside from those ways provided above are possible. In some cases, the number of unit cells controlled by one magnitude bit might not differ from the number of unit cells controlled by another magnitude bit by an integer factor. In some cases, the number of unit cells controlled by one magnitude bit may be the same as the number of unit cells controlled by another magnitude bit.

The current generator 215 may allow for a high efficiency limit. In some aspects, for high dense modulation (e.g., 1,024 quadrature amplitude modulation (QAM)), the current generator 215 shown in FIG. 4 may allow for a theoretical efficiency limit of around 54%. In one or more implementations, components in the unit cells within each transmitter section and between different transmitter sections are generally identical to each other. The unit cells and the components therein are considered to be matched with one another. For example, transistors that form the first current source (e.g., the first current source 412A) in one unit cell (e.g., the unit cell 410A) may have the same characteristics (e.g., threshold voltage, physical dimensions, etc.) as transistors that form the first current source in another unit cell within the same transmitter section or in a different transmitter section (e.g., the first current source 412B).

Figure 5:
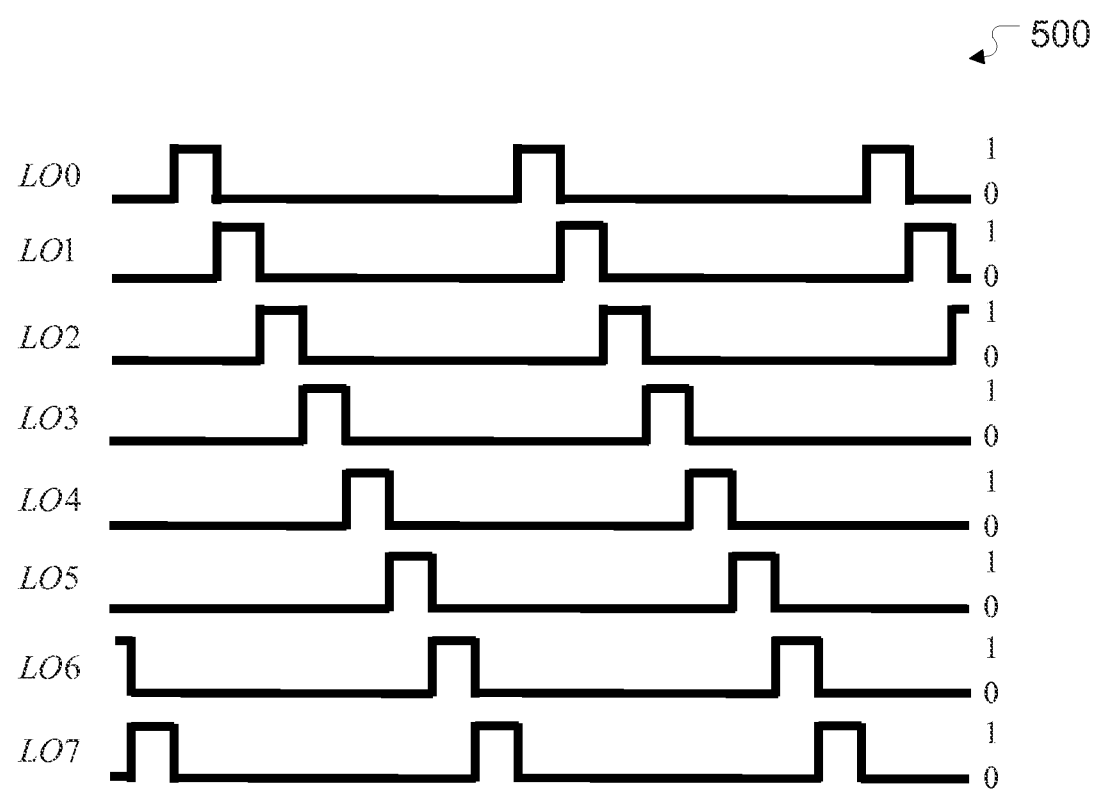
FIG. 5 illustrates a waveform diagram of local oscillator clock signals in accordance with one or more implementations.

FIG. 5 illustrates a waveform diagram 500 of LO clock signals in accordance with one or more implementations. The LO signals may be generated by the LOGEN 160 shown in FIG. 1 and/or may be utilized with the current generator 215 shown in FIG. 4. Activation or deactivation of the unit cells of the current generator 215 may be based on the LO signals. In some aspects, the LO signals approximate a square waveform.

Each LO clock signal waveform is shifted in phase and each corresponds to a respective phase in the clock cycle. The LO signals have successive phase shifts substantially equal to 360°/M and have duty cycles substantially equal to 1/M, where M is a number of LO signals employed. By way of non-limiting example, the waveform diagram 500 illustrates a clock cycle that includes eight non-overlapping clock phases, where each LO clock signal waveform is shifted in phase by 12.5% (or one-eighth of the clock cycle). Thus, the $LO_0$ signal is 180 degrees out of phase with the $LO_4$ signal, the $LO_1$ signal is 180 degrees out of phase with the $LO_5$ signal, the $LO_2$ signal is 180 degrees out of phase with the $LO_6$ signal, and the $LO_3$ signal is 180 degrees out of phase with the $LO_7$ signal. Conversely, the number of LO clock signals may be equivalent to the number of phases in the clock cycle. As such, an eight-phase clock cycle includes eight LO clock signals, each having a duty cycle that is one-eighth of the clock cycle.

Figure 6:
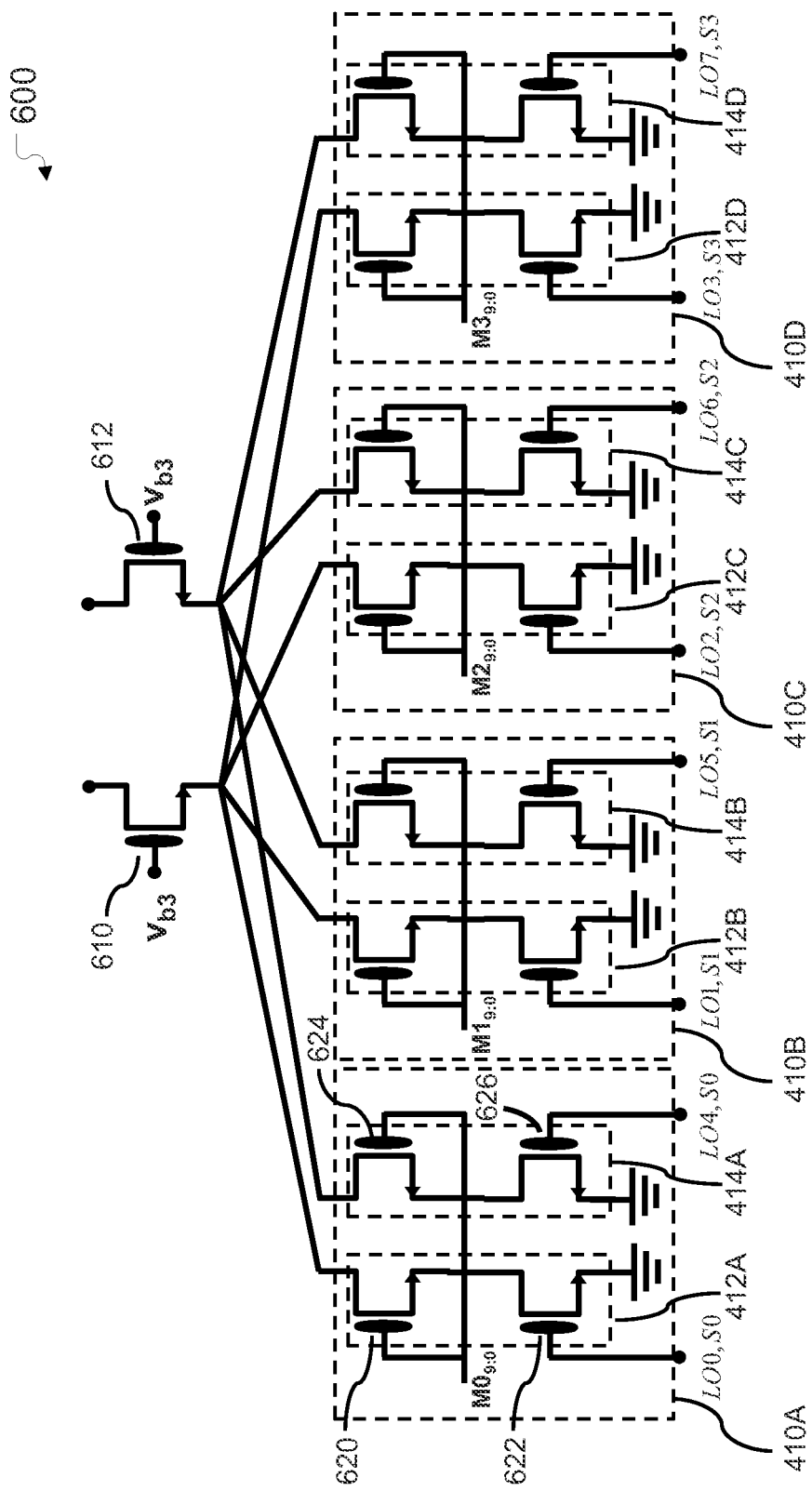
FIG. 6 illustrates an example unit cell group in accordance with one or more implementations.

FIG. 6 illustrates an example unit cell group 600 of the current generator 215 shown in FIG. 4, in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The unit cell group 600 includes the unit cell 410A, the unit cell 410B, the unit cell 410C, and the unit cell 410D associated with transmission section 0 (e.g., associated with 0° signal component), transmitter section 1 (e.g., associated with signal 45° component), transmitter section 2 (e.g., associated with 90° signal component), and transmitter section 3 (e.g., associated with 135° signal component), respectively. The unit cell group 600 also includes a transistor 610 and a transistor 612 coupled to the unit cells 410A, 410B, 410C, and 410D. In one or more implementations, the unit cells 410A, 410B, 410C, and 410D are provided in one deep well (e.g., deep n-type well).

The unit cell 410A includes the first current source 412A and the second current source 414A, the unit cell 410B includes the first current source 412B and the second current source 414B, the unit cell 410C includes the first current source 412C and the second current source 414C, and the unit cell 410D includes the first current source 412D and the second current source 414D. For explanatory purposes, the discussion will be made with reference to the first current source 412A and the second current source 414A of the transmitter section 0, although similar discussions may be made for the first current source and the second current source of the other transmitter sections.

The first current source 412A and the second current source 414A may include cascode arrangements formed of serially-connected transistors. The cascode arrangements may allow for large output impedance. The first current source 412A includes a cascode arrangement that includes transistors 620 and 622. The second current source 414A includes a cascode arrangement that includes transistors 624 and 626. The transistors 620 and 624 are activated (e.g., on) or deactivated (e.g., off) based at least on the magnitude bits $M0_{9:0}$. For example, a signal derived based on the magnitude bits $M0_{9:0}$ may be utilized to control activated or deactivated state of the transistors 620 and 624. The transistors 620 and 624 may be activated when the signal provided to the transistors 620 and 624 is a high level signal (e.g., logic high) and deactivated when the signal is a low level signal (e.g., logic low).

The transistors 622 and 626 are activated or deactivated based at least on the local oscillator signals $LO_0$ and $LO_4$ and the sign bit S0. In one or more implementations, the transistor 622 is activated or deactivated based at least on values (e.g., logic high or logic low) of the local oscillator signal $LO_0$ and the sign bit S0, and the transistor 626 is activated or deactivated based at least on values of the local oscillator signal $LO_4$ and the sign bit S0. In such implementations, the transistors 622 and 626 may be activated or deactivated based on a mixing of the local oscillator signals and the sign bit. For example, the transistor 622 may be activated or deactivated based on $LO_0 \oplus S0$ and the transistor 626 may be activated or deactivated based on $LO_4 \oplus S0$, where $\oplus$ represents an exclusive-or (XOR) operation. In some aspects, the $\oplus$ operation may be implemented as a swapping operation, which will be discussed later in the present disclosure.

Similar cascode arrangements and control signals (e.g., LO signals, sign bit, magnitude bit sequence) applied to the cascode arrangements are shown for the unit cells 410B, 410C, and 410D. For example, the unit cell 410B includes two transistors that are activated or deactivated based at least on the magnitude bits $M1_{9:0}$ and two transistors that are activated or deactivated based at least on the local oscillator signals $LO_1$ and $LO_5$ and the sign bit S1.

The transistor 620 is connected to the transistor 610 and the transistor 624 is connected to the transistor 612. The transistors 610 and 612 may be high-voltage (HV) transistors (e.g., high threshold voltage transistors) that may be utilized to prevent overvoltage. A voltage $vb_3$ may be applied to the transistors 610 and 612. Overvoltage may occur when a voltage in a circuit or a part of a circuit is raised to a voltage level higher than an operating voltage limit of one or more components of the circuit. Overvoltage may lead to breakdown of a transistor and cause reliability issues. For example, in a 28 nanometer CMOS process, the operating voltage limit may be around 3.3 V for the transistors 610 and 612 and around 0.9 to 1.0 V for the transistors (e.g., the transistors 620, 622, 624, 626) of the unit cells. The transistors 610 and 612 may help cause voltages seen by the various components of the unit cell group 600, such as the transistors in the unit cells 410A, 410B, 410C, and 410D, to be lower than a respective voltage limit of these various components. The transistors 610 and 612 may be shared between the unit cells 410A, 410B, 410C, and 410D of the transmitter sections.

With reference to FIGS. 4 and 6, the transistors 610 and 612 of the unit cell group 600 may be connected to the transformer 425. In some aspects, the current generator 215 may be or may include $2^{10}$ unit cell groups coupled to the transformer 425, where each unit cell group may be the unit cell group 600 shown in FIG. 6. In other aspects, a different number of unit cell groups may be coupled to the transformer 425, where each unit cell group may be the unit cell group 600 shown in FIG. 6.

Although FIG. 5 utilizes cascode arrangements formed by two serially-connected transistors, the cascode arrangements may include more than two serially-connected transistors. Furthermore, although the transistors (e.g., the transistors 610, 612, 620, 622, 624, and 626) are illustrated as n-type metal-oxide-semiconductor (NMOS) transistors, the transistors may be p-type metal-oxide-semiconductor (PMOS) transistors, other types of transistors, or combination thereof. In one or more implementations, the transistors (e.g., the transistors 620, 622, 624, 626) of the unit cells may have low threshold voltage (e.g., 0.3 V). The transistors of the unit cells may be referred to as core transistors.

Figure 7:
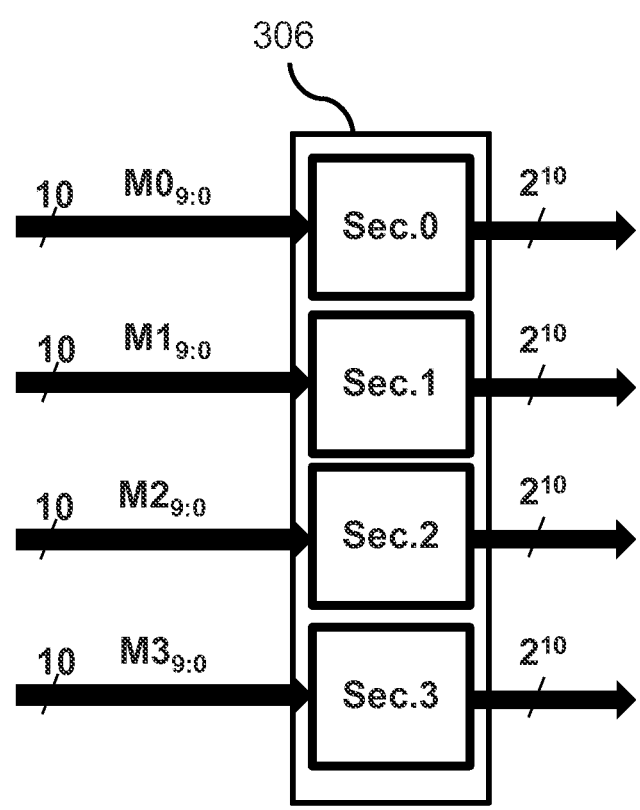
FIG. 7 illustrates an example encoder circuit in accordance with one or more implementations.

FIG. 7 illustrates an example of the encoder circuit 306 shown in FIG. 3, in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The encoder circuit 306 may generate control signals based on magnitude bit sequences associated with each of the transmitter sections of the current generator 215. In some aspects, for a magnitude bit sequence that includes n bits, the encoder circuit 306 generates $2^n$ control signals. Each of the $2^n$ control signals may be provided to one of the unit cells of a transmitter section. For example, for the magnitude bit sequence of $M0_{9:0}=0010010_2=37_{10}$, the encoder circuit 306 may generate 37 control signals associated with a high signal level (e.g., logic high) and 987 control signals associated with a low signal level (e.g., logic low). The 37 control signals associated with a high signal level may be utilized to activate 37 unit cells of transmitter section 0 and the 987 control signals associated with a low signal level may be utilized to deactivate 987 unit cells of transmitter section 0. In this case, the 37 unit cells among the 1,024 unit cells that are activated may be selected (e.g., by the transmitter controller circuit 145 and/or the encoder circuit 306) at random, based on a predetermined order, or by some other manner.

Alternatively or in addition, a signal may be or may be derived from each bit of the magnitude bit sequence. For example, the magnitude bit sequence $M0_{9:0}$ may be written as $b_9 b_8 b_7 b_6 b_5 b_4 b_3 b_2 b_1 b_0$, with $b_0$ being the least significant bit and $b_9$ being the most significant bit. The $b_0$ bit signal may be coupled to $2^0$ unit cell, the $b_1$ bit signal may be coupled to $2^1$ unit cells, the $b_2$ bit signal may be coupled to $2^2$ unit cells, the $b_3$ bit signal may be coupled to $2^3$ unit cells, and so forth. When a bit signal is set to a high signal level (e.g., logic high), the unit cells to which the bit signal is applied may be activated. When a bit signal is set to a low signal level (e.g., logic low), the unit cells to which the bit signal is applied may be deactivated. For example, if $b_5=1$, then the $2^5$ unit cells that receive the $b_5$ bit signal are activated. As another example, if $b_7=0$, then the $2^7$ unit cells that receive the $b_7$ bit signal are deactivated. In one or more implementations, some of the unit cells may be controlled based on the control signals from the encoder circuit 306, whereas other unit cells may be controlled based directly on the individual bits of the magnitude bit sequence. Other manners by which to utilize the magnitude bit sequence to determine the number of unit cells to activate are possible.

Figure 8:
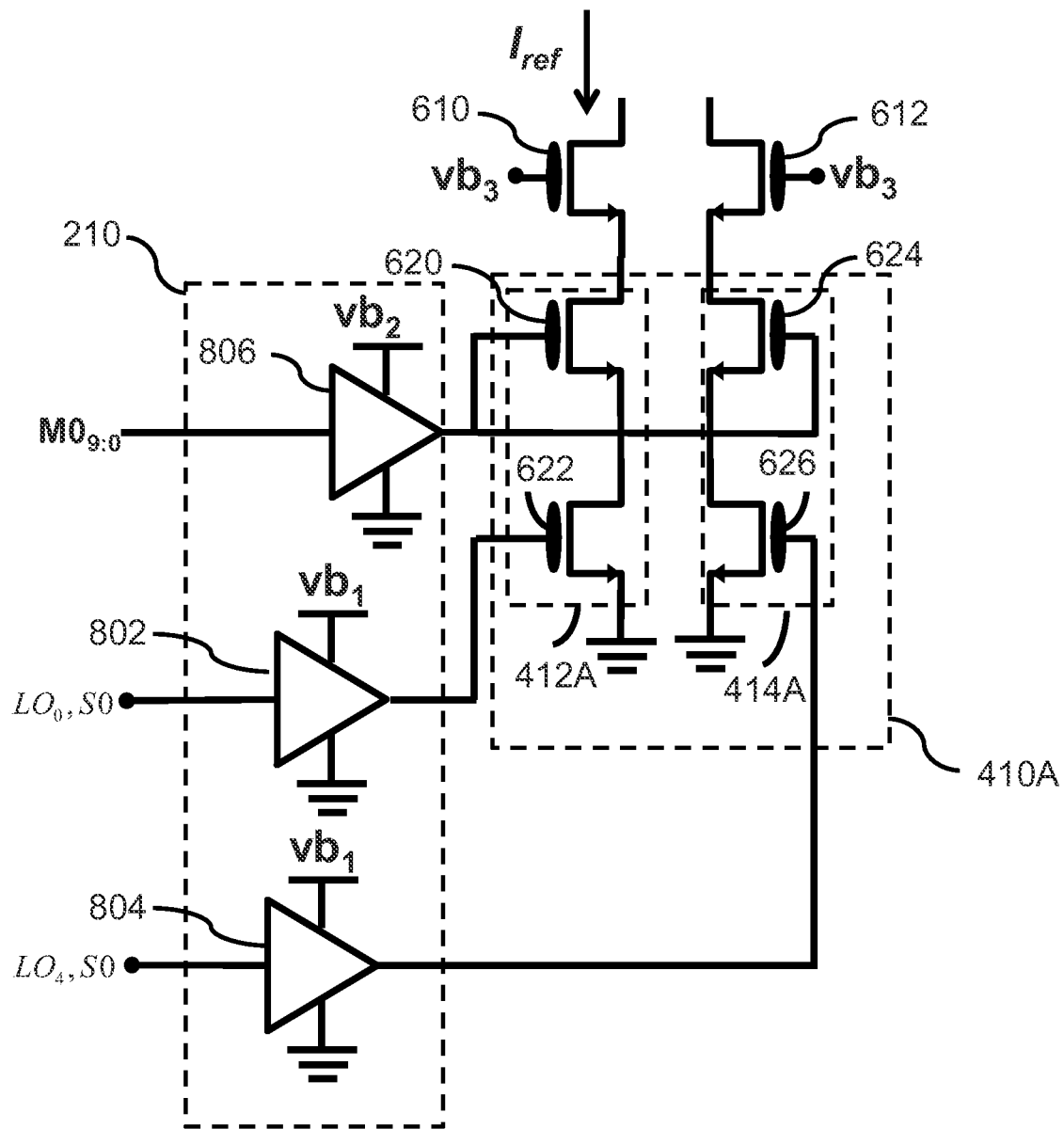
FIG. 8 illustrates an example driver circuit in accordance with one or more implementations.

FIG. 8 illustrates an example of the driver circuit 210 shown in FIG. 2, along with voltages applied to the transistors 620, 622, 624, and 626 of the unit cell 410A shown in FIG. 4, in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The transistors 620 and 624 may be coupled to an output of a buffer 806. The buffer 806 may output a voltage $vb_2$ and apply the voltage $vb_2$ to the transistors 620 and 624 when a high signal level is provided to an input of the buffer 806. The buffer 806 may tie the transistors 620 and 624 to ground when a low signal level is provided to the input of the buffer 806. The transistors 620 and 624 may be activated when the voltage $vb_2$ is applied to the transistors 620 and 624 and deactivated when the transistors 620 and 624 are tied to ground. The input of the buffer 806 may be based at least on the magnitude bit sequence $M0_{9:0}$.

The transistor 622 may be coupled to an output of a buffer 802. The transistor 626 may be coupled to an output of a buffer 804. The buffers 802 and 804 may output a voltage $vb_1$ and apply the voltage $vb_1$ to the transistors 622 and 626, respectively, when a high signal level is provided to a respective input of the buffers 802 and 804. The buffers 802 and 804 may tie the transistors 622 and 626, respectively, to ground when a low signal level is provided to the respective input of the buffers 802 and 804. The transistors 622 and 626 may be activated when the voltage $vb_1$ is applied to the transistors 622 and 626 and deactivated when the transistors 622 and 626 are tied to ground. The input to the buffer 802 may be based at least on the local oscillator signal $LO_0$ and the sign bit S0. The input to the buffer 804 may be based at least on the local oscillator signal $LO_4$ and the sign bit S0. For example, the respective inputs to the buffers 802 and 804 may be based on a mixing of the respective local oscillator signals with the sign bit S0.

In one or more implementations, the buffers 802, 804, and/or 806 may be a last stage of serially-connected buffers. One or more buffers (not shown) in prior stages may have a supply voltage $V_{DD}$ of around 0.9 to 1.0 V applied, whereas the buffers 802 and 804 has a supply voltage provided by the voltage $vb_1$ and the buffer 806 has a supply voltage provided by the voltage $vb_2$.

In one or more implementations, the voltages $vb_1$ and $vb_2$ may be generated based on a reference voltage, such as through the use of a voltage divider. The reference voltage may be a supply voltage $V_{DD}$ provided by the power supply 180 shown in FIG. 1. For example, for a $V_{DD}$ of 1 V, the voltage $vb_1$ may be around 500 mV to 550 mV and the voltage $vb_2$ may be around 700 mV to 750 mV. Utilization of the voltages $vb_1$ and $vb_2$ that are lower than the supply voltage $V_{DD}$ may allow the transistors 620 and 622 and the transistors 624 and 626 to operate as current sources in the active region with well-defined currents. In some aspects, utilization of such voltages $vb_1$ and $vb_2$ with the transistors (e.g., the transistors 620, 622, 624, 626) of the unit cells, which may have low threshold voltage (e.g., 0.3 V), allows for lower power consumption.

Figure 9:
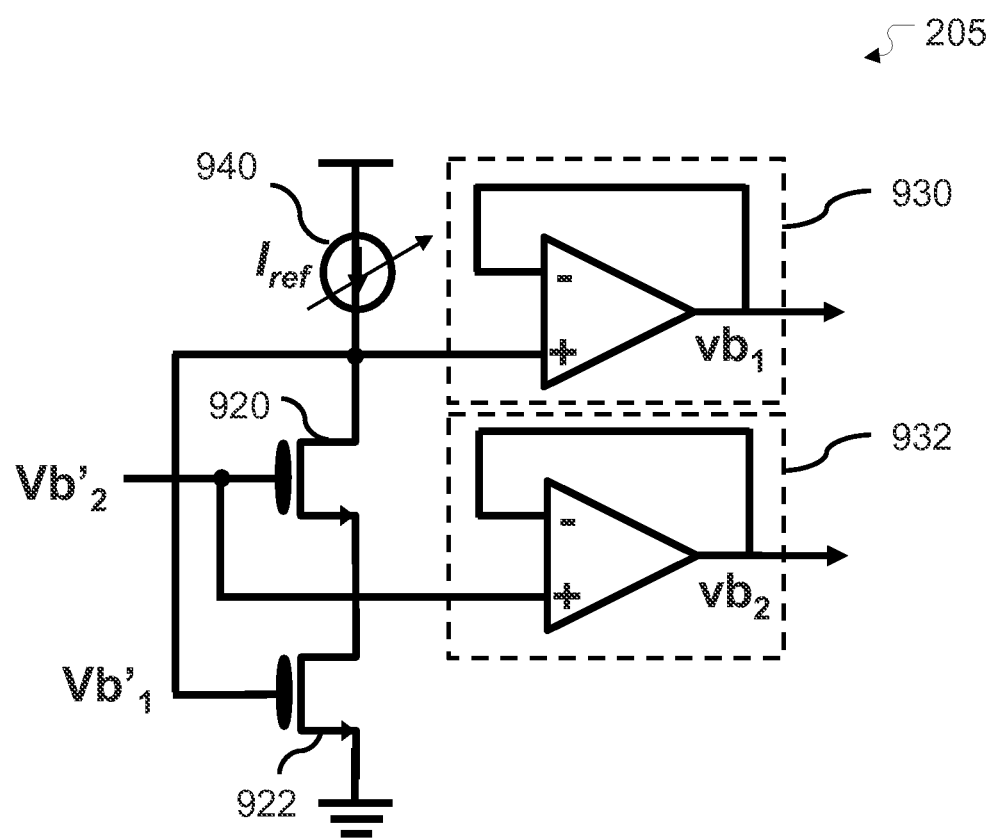
FIG. 9 illustrates an example voltage generator in accordance with one or more implementations.

FIG. 9 illustrates an example of the voltage generator 205 shown in FIG. 2 for generating voltages $vb_1$ and $vb_2$ for the driver circuit 210 shown in FIG. 8, in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided. In one or more implementations, the voltage generator 205 is shared by all the unit cells of the current generator 215 shown in FIG. 4.

The voltage generator 205 includes a transistor 920, a transistor 922, a feedback circuit 930, a feedback circuit 932, and a reference current source 940. The feedback circuit 930 receives a voltage $Vb_1'$ and provides as output a voltage $vb_1$. The voltages $Vb_1'$ and $vb_1$ may be equal to or nearly equal to each other. Similarly, the feedback circuit 932 receives a voltage $Vb_2'$ and provides as output a voltage $vb_2$. The voltages $Vb_2'$ and $vb_2$ may be equal to or nearly equal to each other. In some aspects, the feedback circuits 930 and/or 932 may utilize negative feedback to allow the respective voltage $vb1$ and $vb_2$ to be equal to or nearly equal to the voltage $Vb_1'$ and $Vb_2'$, respectively. In one or more implementations, the feedback circuit 930 and/or 932 may be, may include, or may be a part of, a linear voltage regulator, such as a low-dropout (LDO) regulator. Example values for the voltage $Vb_1'$ and $Vb_2'$ are 550 mV and 700 mV, respectively, although other voltage values may be utilized depending on application. In some aspects, the voltage $vb_1$ and $vb_2$ may differ from voltage $Vb_1'$ and $Vb_2'$, respectively, for example, within approximately 5 mV to 10 mV.

In one or more implementations, the transistors 920 and 922 form a replica circuit of the transistors 620 and 622 shown in FIG. 8 and form a replica circuit of the transistors 624 and 626 shown in FIG. 8. To form a replica circuit, the transistors 920 and 922 are generally identical or nearly identical to (e.g., same or similar threshold voltage, physical dimensions, etc.) the transistors 620 and 622, respectively, and to the transistors 624 and 626, respectively. Utilization of the transistors 920 and 922 to form a replica circuit, in conjunction with the feedback circuits 930 and 932, may allow a replication of voltages applied to the transistors 920 and 922 to also be applied to the transistors 620 and 622, respectively, and to the transistors 624 and 626, respectively. With reference to FIGS. 8 and 9, the voltage $Vb_1'$ is applied to the transistor 922 and the voltage $vb_1$, which may be equal to or nearly equal to the voltage $Vb_1'$, is applied to the transistors 622 and 626. The voltage $Vb_2'$ is applied to the transistor 920 and the voltage $vb_2$, which may be equal to or nearly equal to the voltage $Vb_2'$, is applied to the transistors 620 and 624.

The reference current source 940 may provide a current $I_{ref}$, and the current $I_{ref}$ may be mirrored as shown in FIG. 8. The reference current source 940 may be utilized to set the unit currents $I_{u1}$ and $I_{u2}$ shown in FIG. 4 such that $I_{u1}=I_{ref}$ and $I_{u2}=-I_{ref}$, or vice versa. An example current $I_{ref}=16$ mA may be utilized, although other current values may be utilized depending on the application.

Figure 10:
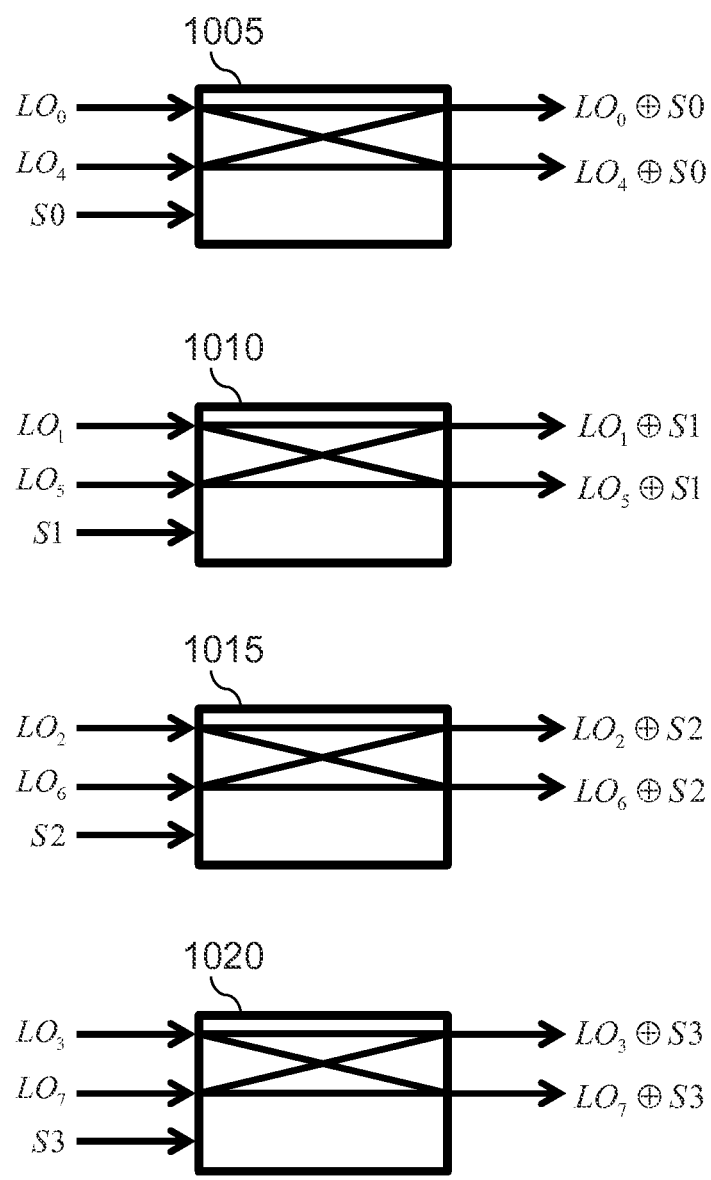
FIG. 10 illustrates example mixing circuits in accordance with one or more implementations.

FIG. 10 illustrates mixing circuits 1005, 1010, 1015, and 1020, in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The mixing circuits 1005, 1010, 1015, and 1020 may be utilized with transmitter sections 0, 1, 2, and 3, respectively, of the current generator 215 shown in FIG. 4, as well as with the driver circuit 210 and the voltage generator 205 shown in FIGS. 8 and 9, respectively. The mixing circuit 1005 receives LO signals $LO_0$ and $LO_4$ mixes these LO signals with the sign bit S0. The outputs of the mixing circuit 1005 may be denoted as $LO_0 \oplus S0$ and $LO_4 \oplus S0$. In one or more implementations, one or more of the mixing circuits 1005, 1010, 1015, and 1020 may be multiplexing circuits.

The mixing circuit 1005 may perform a swapping operation to obtain the outputs $LO_0 \oplus S0$ and $LO_4 \oplus S0$. When the sign bit S0 is 0, the LO signals follow a straight path since $LO_0 \oplus S0=LO_0$ and $LO_4 \oplus S0=LO_4$. When the sign bit S0 is 1, the LO signals may be swapped since $LO_0 \oplus S0=LO_4$ and $LO_4 \oplus S0=LO_0$. Thus, the sign bit S0 may be considered a swapping-enable bit, where an S0 of 1 indicates that the input LO signals are swapped to obtain the output LO signals, whereas an S0 of 0 indicates that the input LO signals are not to be swapped. The mixing circuits 1010, 1015, and 1020 may operate in the same manner, with each of the mixing circuits 1010, 1015, and 1020 receiving their respective LO signals and sign bit. For example, the mixing circuit 1010 receives LO signals $LO_1$ and $LO_5$ and sign bit S1 and outputs $LO_1 \oplus S1$ and $LO_5 \oplus S1$.

Figure 11:
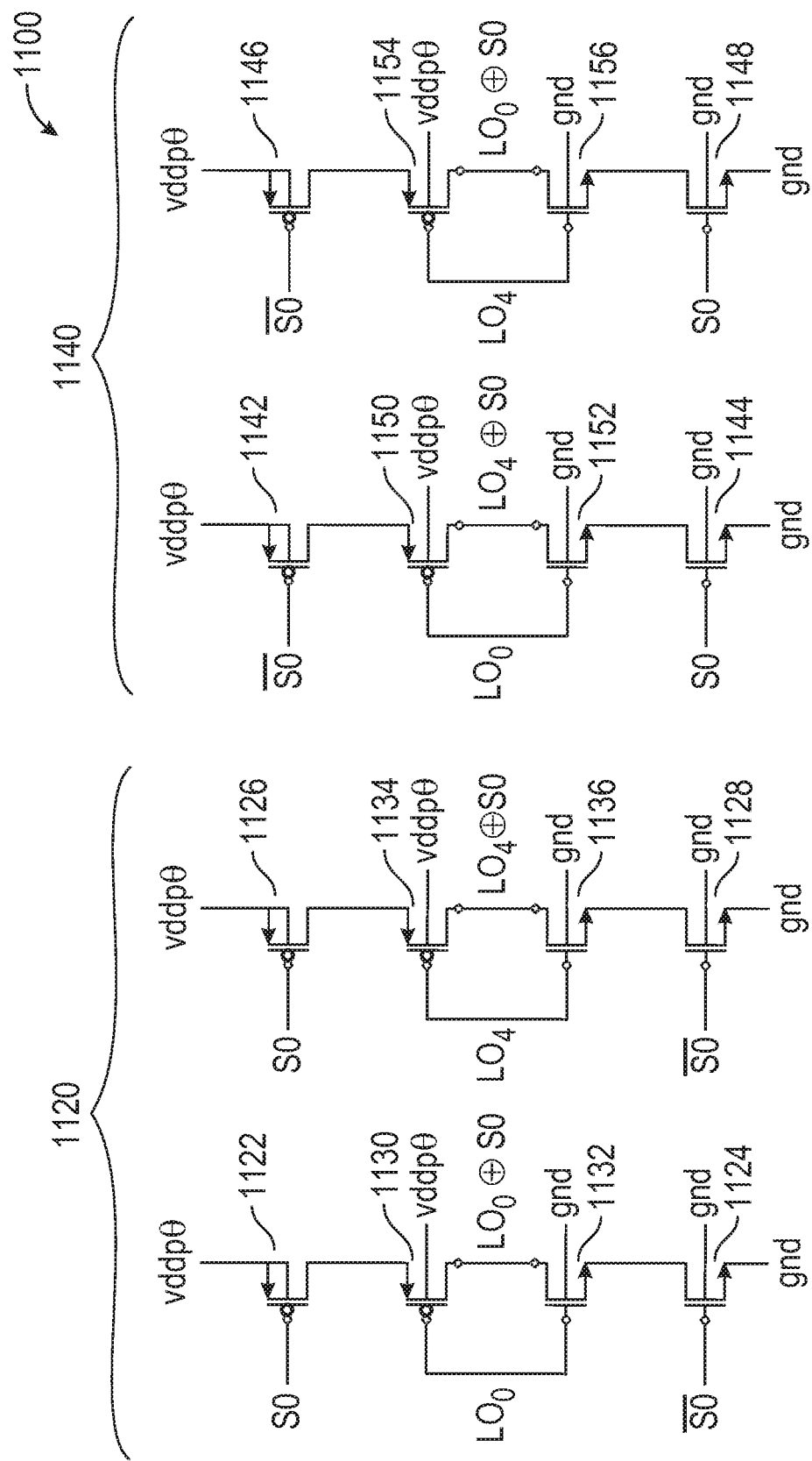
FIG. 11 illustrates an example mixing circuit in accordance with one or more implementations.

FIG. 11 illustrates an example mixing circuit 1100 in accordance with one or more implementations. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided. The mixing circuit 1100 may be, may include, or may be a part of, the mixing circuit 1005 shown in FIG. 10. Mixing circuits similar or identical to the mixing circuit 1100 may be, may include, or may be a part of, the mixing circuits 1010, 1015, or 1020 shown in FIG. 10.

The mixing circuit 1100 includes a portion 1120 and a portion 1140. The portion 1120 includes transistors 1122, 1124, 1126, 1128, 1130, 1132, 1134, and 1136. The portion 1140 includes transistors 1142, 1144, 1146, 1148, 1150, 1152, 1154, and 1156. For explanatory purposes, for the portion 1120, the transistors 1122, 1126, 1130, and 1134 are p-type transistors (e.g., PMOS transistors) and the transistors 1124, 1128, 1132, and 1136 are n-type transistors (e.g., NMOS transistors). For the portion 1140, the transistors 1142, 1146, 1150, and 1154 are p-type transistors and the transistors 1144, 1148, 1152, and 1156 are n-type transistors. The transistors 1130 and 1132, transistors 1134 and 1136, transistors 1150 and 1152, and transistors 1154 and 1156 may form inverters (e.g., CMOS inverters).

When the sign bit S0 is 0, the transistors 1122, 1124, 1126, and 1128 in the portion 1120 are activated, whereas the transistors 1142, 1144, 1146, and 1148 in the portion 1140 are deactivated. Thus, when the sign bit S0 is 0, the portion 1120 is activated and the portion 1140 is deactivated. In such a case, the outputs $LO_0 \oplus S0$ and $L_4 \oplus S0$ are tapped from the portion 1120, and output impedance of the portion 1140 is effectively infinite. The notation $\overline{S0}$ denotes the inverse of S0, such that when S0 is 1 (e.g., logic high) then $\overline{S0}$ is 0 (e.g., logic low) and vice versa.

When the sign bit S0 is 1, the transistors 1122, 1124, 1126, and 1128 in the portion 1120 are deactivated, whereas the transistors 1142, 1144, 1146, and 1148 in the portion 1140 are activated. Thus, when the sign bit S0 is 1, the portion 1120 is deactivated and the portion 1140 is activated. In such a case, the outputs $LO_0 \oplus S0$ and $LO_4 \oplus S0$ are tapped from the portion 1140, and output impedance of the portion 1120 is effectively infinite.

In one or more implementations, the outputs $LO_0 \oplus S0$ and $LO_4 \oplus S0$ of the mixing circuit 1100 are provided to each of the unit cells (e.g., the unit cell 410A shown in FIG. 4) associated with transmitter section 0 of the current generator 215 shown in FIG. 4. For example, the outputs $LO_0 \oplus S0$ and $LO_4 \oplus S0$ of the mixing circuit 1100 may be provided to the buffers 802 and 804, respectively, shown in FIG. 8.

The subject technology provides apparatuses that include transmitter circuits programmable by control signals. The subject technology may scale along with the down-scaling of CMOS technology, contrary to conventional transmitter circuit design. In one or more implementations, the subject technology allows for high efficiency and small silicon area usage.

In the semiconductor industry environment of foundries and fabless companies, it is the foundries that develop, specify, and provide the physical structures that designers use to implement their designs. Foundries provide manufacturing services to many fabless semiconductor companies, but to operate profitably, manufacturing processes are optimized to achieve high yields. Such optimizations typically require that limitations be placed on the variety of structures that can be produced by a particular manufacturing process. Consistent with the foregoing, foundries typically provide a limited set of transistor structures that are intended to cover a broad range of circuit applications.

One or more implementations are performed by one or more integrated circuits, such as application specific integrated circuits (ASICs) or field programmable gate arrays (FPGAs). In one or more implementations, such integrated circuits execute instructions that are stored on the circuit itself. The term "integrated circuit" or "semiconductor device" may include, but is not limited to, a design tool output file as binary code encompassing the overall physical design of the integrated circuit or semiconductor device, a data file encoded with code representing the overall physical design of the integrated circuit or semiconductor device, a packaged integrated circuit or semiconductor device, or an unpackaged die. The data file can include elements of the integrated circuit or semiconductor device, interconnections of those elements, and timing characteristics of those elements (including parasitics of the elements).

The various illustrative blocks, elements, components, and methods described herein may be implemented as electronic hardware. Various illustrative blocks, elements, components, and methods have been described above generally in terms of their functionality. Whether such functionality is implemented as hardware depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Any of the blocks may be performed simultaneously. In one or more implementations, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

As used herein, the term "substrate" refers to the physical object that is the basic workpiece transformed by various process operations into the desired microelectronic configuration. A typical substrate used for the manufacture of integrated circuits is a wafer. Wafers may be made of semiconducting (e.g., bulk silicon), non-semiconducting (e.g., glass), or combinations of semiconducting and non-semiconducting materials (e.g., silicon-on-insulator (SOI)). In the semiconductor industry, a bulk silicon wafer is commonly used for the manufacture of integrated circuits.

As used in this specification and any claims of this application, the terms "receiver", "transmitter", "amplifier", "mixing circuit", "processor", and "memory" all refer to electronic or other technological devices. These terms exclude people or groups of people.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The word "exemplary" is used herein to mean "serving as an example, instance, or illustration". Any embodiment described herein as "exemplary" or as an "example" is not necessarily to be construed as preferred or advantageous over other embodiments. Furthermore, to the extent that the term "include", "have", or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for".

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more". Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. An apparatus, comprising:
   a controller circuit configured to generate control signals based at least on a received signal, the control signals comprising a first set of signals based at least on a polarity of the received signal and a second set of signals based at least on a magnitude of the received signal; and
   a transmitter circuit comprising a plurality of unit cells, wherein each of the plurality of unit cells comprises a respective first current source and a respective second current source, and each of the plurality of unit cells is configured to be set in an activated state or a deactivated state based at least on the control signals,
   wherein when a unit cell of the plurality of the unit cells is set in the activated state, the respective first current source or the respective second current source is configured to generate a current to be applied to a load.

2. The apparatus of claim 1, wherein the transmitter circuit comprises a plurality of transmitter sections, each of the plurality of transmitter sections comprising at least one of the plurality of unit cells, the controller circuit being further configured to:
   generate one or more component signals based at least on the received signal, each of the one or more component signals being associated with one of the plurality of transmitter sections; and
   generate the control signals for each of the plurality of transmitter sections based at least on the one or more component signals.

3. The apparatus of claim 2, wherein the plurality of transmitter sections comprises N transmitter sections, the apparatus further comprising a local oscillator (LO) generator configured to generate 2×N non-overlapping LO signals, wherein each of the plurality of unit cells is configured to be set in the activated state or the deactivated state based further on at least one of the 2×N non-overlapping LO signals.

4. The apparatus of claim 2, further comprising:
   a first transistor connected to a unit cell from each of the plurality of transmitter sections, and
   a second transistor connected to the unit cell from each of the plurality of transmitter sections.

5. The apparatus of claim 1, wherein the controller circuit is configured to generate the first set of signals based at least on local oscillator (LO) signals and the polarity of the received signal.

6. The apparatus of claim 1, wherein, for at least one unit cell of the plurality of unit cells, the respective first current source comprises a first plurality of serially-connected transistors and the respective second current source comprises a second plurality of serially-connected transistors.

7. The apparatus of claim 6, wherein:
at least one transistor of the first plurality of serially-connected transistors is configured to be activated based at least on the first set of signals, and
at least one transistor of the second plurality of serially-connected transistors is configured to be activated based at least on the second set of signals.

8. The apparatus of claim 6, further comprising a voltage generator configured to generate voltages for the first plurality of serially-connected transistors and the second plurality of serially-connected transistors, wherein the voltage generator comprises:
a first transistor;
a second transistor;
a first feedback circuit connected with the first transistor and configured to generate a first voltage; and
a second feedback circuit connected with the second transistor and configured to generate a second voltage, wherein:
at least one transistor of the first plurality of serially-connected transistors and at least one transistor of the second plurality of serially-connected transistors are configured to be activated based on the first voltage, and
at least one other transistor of the first plurality of serially-connected transistors and at least one other transistor of the second plurality of serially-connected transistors are configured to be activated based on the second voltage.

9. The apparatus of claim 8, further comprising:
a first buffer comprising a first signal input and a first power supply input, wherein the first buffer is configured to:
receive at least one of the first set of signals at the first signal input and the first voltage at the first power supply input; and
apply, to the at least one transistor of the first plurality of serially-connected transistors, a third voltage based at least on the at least one of the first set of signals and the first voltage.

10. The apparatus of claim 9, further comprising:
a second buffer comprising a second signal input and a second power supply input, wherein the second buffer is configured to:
receive at least one of the second set of signals at the second signal input and the second voltage at the second power supply input; and
apply, to the at least one other transistor of the first plurality of serially-connected transistors and the at least one other transistor of the second plurality of serially-connected transistors, a fourth voltage based at least on the at least one of the second set of signals and the second voltage.

11. A communication device, comprising:
an antenna configured to receive signals and transmit signals;
a transmitter circuit coupled to the antenna, the transmitter circuit comprising a plurality of transmitter sections and a plurality of unit cells, each of the plurality of transmitter sections comprising at least one of the plurality of unit cells, each of the plurality of unit cells comprising a respective first current source and a respective second current source, and each of the plurality of unit cells being configured to be set in an activated state or a deactivated state based at least on control signals generated by a controller circuit, wherein when a unit cell of the plurality of unit cells is set in the activated state, one of the respective first current source or the respective second current source is configured to generate a current; and
the controller circuit configured to:
generate one or more component signals based at least on a baseband signal, each of the one or more component signals being associated with one of the plurality of transmitter sections; and
generate the control signals for the at least one of the plurality of unit cells of each of the plurality of transmitter sections based at least on the one or more component signals.

12. The communication device of claim 11, further comprising a transformer configured to receive current from the plurality of unit cells and provide a signal to the antenna, wherein the received current is based on the baseband signal and the provided signal is based on the received current.

13. The communication device of claim 11, wherein:
the control signals comprise a first set of signals and a second set of signals, and
the controller circuit is configured to:
generate the first set of signals based at least on a polarity of the baseband signal and local oscillator (LO) signals, and
generate the second set of signals based at least on a magnitude of the baseband signal.

14. The communication device of claim 13, wherein, for at least one unit cell of the plurality of unit cells, the respective first current source comprises a first plurality of serially-connected transistors and the respective second current source comprises a second plurality of serially-connected transistors.

15. The communication device of claim 14, wherein:
at least one transistor of the first plurality of serially-connected transistors is configured to be activated based at least on the first set of signals, and
at least one transistor of the second plurality of serially-connected transistors is configured to be activated based at least on the second set of signals.

16. The communication device of claim 14, further comprising a voltage generator configured to generate voltages for the first plurality of serially-connected transistors and the second plurality of serially-connected transistors, wherein the voltage generator comprises:
a first transistor;
a second transistor;
a first feedback circuit connected with the first transistor and configured to generate a first voltage; and
a second feedback circuit connected with the second transistor and configured to generate a second voltage, wherein:
at least one transistor of the first plurality of serially-connected transistors and at least one transistor of the second plurality of serially-connected transistors are configured to be activated based on the first voltage, and
at least one other transistor of the first plurality of serially-connected transistors and at least one other transistor of the second plurality of serially-connected transistors are configured to be activated based on the second voltage.

17. A method, comprising:
receiving a baseband signal;
generating a plurality of controls signals, wherein the plurality of control signals comprises a first set of control signals based at least on a polarity of the baseband signal and a second set of control signals based at least on a magnitude of the baseband signal;

applying the control signals to a plurality of unit cells of a transmitter circuit;

setting each of the plurality of unit cells in an activated state or a deactivated state based at least on the control signals; and generating, by the transmitter circuit, a current based at least on a number of the plurality of unit cells that are set in the activated state.

18. The method of claim 17, further comprising generating a plurality of local oscillator (LO) signals, wherein the control signals comprise the plurality of LO signals.

19. The method of claim 17, wherein:

each of the plurality of unit cells comprises a respective first current source and a respective second current source, for at least one of the plurality of unit cells, the first current source comprises a first transistor and a second transistor serially-connected to the first transistor, and applying the control signals comprises applying at least one of the first set of control signals to the first transistor and at least one of the second set of control signals to the second transistor.

* * * * *